United States Patent
Huang et al.

(10) Patent No.: US 9,425,363 B2
(45) Date of Patent: Aug. 23, 2016

(54) LIGHT EMITTING DEVICE

(71) Applicant: EPISTAR CORPORATION, Hsinchu (TW)

(72) Inventors: Chien-Fu Huang, Hsinchu (TW); Chiu-Lin Yao, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 2 days.

(21) Appl. No.: 14/098,707

(22) Filed: Dec. 6, 2013

(65) Prior Publication Data

US 2014/0159090 A1 Jun. 12, 2014

(30) Foreign Application Priority Data

Dec. 7, 2012 (TW) .............................. 101146332 A

(51) Int. Cl.
| | |
|---|---|
| H01L 27/15 | (2006.01) |
| H01L 29/26 | (2006.01) |
| H01L 31/12 | (2006.01) |
| H01L 33/00 | (2010.01) |
| H01L 33/46 | (2010.01) |
| H01L 33/02 | (2010.01) |
| H01L 33/22 | (2010.01) |
| H01L 33/38 | (2010.01) |
| H01L 33/44 | (2010.01) |

(52) U.S. Cl.
CPC .............. *H01L 33/46* (2013.01); *H01L 33/02* (2013.01); *H01L 33/22* (2013.01); *H01L 33/38* (2013.01); *H01L 33/44* (2013.01); *H01L 2933/0091* (2013.01)

(58) Field of Classification Search
USPC .......... 313/506, 116, 509, 498; 257/E33.074, 257/E33.001, 89
See application file for complete search history.

(56) References Cited

U.S. PATENT DOCUMENTS

| | | | |
|---|---|---|---|
| 7,521,862 B2 | 4/2009 | Mueller et al. | |
| 8,035,119 B2* | 10/2011 | Ng | F21K 9/00 257/100 |
| 8,063,557 B2 | 11/2011 | Hsieh et al. | |
| 2006/0202219 A1* | 9/2006 | Ohashi | H01L 33/20 257/98 |
| 2008/0079014 A1* | 4/2008 | Ng | F21K 9/00 257/98 |
| 2008/0087881 A1 | 4/2008 | Ueda et al. | |
| 2010/0084679 A1* | 4/2010 | Hsieh et al. | 257/98 |
| 2011/0227111 A1* | 9/2011 | Choi | H01L 33/405 257/98 |
| 2011/0316023 A1* | 12/2011 | Yeh | H01L 33/46 257/98 |

OTHER PUBLICATIONS

K.C. Lee et al., Thermochromic materials made of PVA film doped ZnO on the UV/Vis spectral of properties, Hua Kang Journal of Engineering Chinese Culture University 27 (2011), 77-82.

A.L. Stepanov et al, Fabrication of Metal Nanoparticles in Sapphire by Low-Energy Ion Implantation, Rev.Adv.Mater.Sci. 9 (2005), 109-129, Advanced Study Center Co. Ltd.

* cited by examiner

*Primary Examiner* — Telly Green

(74) *Attorney, Agent, or Firm* — Patterson & Sheridan, LLP

(57) ABSTRACT

A light-emitting device is disclosed and comprises: a semiconductor stack; a transparent substrate comprising a first material; a bonding layer which bonds the semiconductor stack and the transparent substrate; and a medium in the transparent substrate, the medium comprising a second material different from the first material.

13 Claims, 3 Drawing Sheets

LIGHT EMITTING DEVICE

TECHNICAL FIELD

The application relates to a light-emitting device, in particular to a light-emitting diode with enhanced light extraction from the sidewalls.

DESCRIPTION OF BACKGROUND ART

A structure of a conventional light-emitting diode is shown in FIG. 1. A light-emitting stack 110 is disposed on a substrate 130 with a bonding layer 120 in between. During package, the substrate 130 is fixed to a carrier 150 with a fixing material 140, and then the whole structure is packaged with an encapsulation resin 160. The light-emitting stack 110 is a semiconductor stack comprising a first conductivity type semiconductor layer 111, an active layer 112, and a second conductivity type semiconductor layer 113 from top to bottom in sequence. The first conductivity type semiconductor layer 111 and the second conductivity type semiconductor layer 113 are of different conductivity types. For example, the first conductivity type semiconductor layer 111 is an n-type semiconductor layer, and the second conductivity type semiconductor layer 113 is a p-type semiconductor layer. When an external power is supplied, the first conductivity type semiconductor layer 111 and the second conductivity type semiconductor layer 113 generates carriers (electrons/holes) respectively, and the carriers recombine in the active layer 112 to generate light. In addition, a first electrode 114 is set on the first conductivity type semiconductor layer 111, and a second electrode 115 is set on the second conductivity type semiconductor layer 113 to conduct the electrical current. For a light-emitting diode of this kind of structure, the light extraction depends mainly on the light extraction from the top side. As shown in the figure, the condition when the light emitted by the light-emitting stack 110 travels downward and arrives at the sidewalls of the substrate 130 is shown at the point A. Since the substrate 130 has a refractive index n=1.7 (taking a sapphire substrate for an example) and the encapsulation resin 160 has a refractive index n=1.5, according to Snell's law, when the light is incident to the surface of the encapsulation resin 160 at an angle greater than the critical angle, an TIR (Total Internal Reflection) occurs and light can't be transmitted out of the light-emitting diode as indicated by the dashed lines in the figure. It is even worse that the light is absorbed by the light-emitting diode after multiple reflections, which leads to a loss of brightness. Therefore, a light-emitting diode of this kind of structure has a poor light extraction in the sidewalls, and in addition to the affection in the brightness, the far field angle of the light is also relatively small.

SUMMARY OF THE DISCLOSURE

A light-emitting device is disclosed and comprises: a semiconductor stack; a transparent substrate comprising a first material; a bonding layer which bonds the semiconductor stack and the transparent substrate; and a medium in the transparent substrate, the medium comprising a second material different from the first material.

DETAILED DESCRIPTION OF PREFERRED EMBODIMENTS

Figure 2:
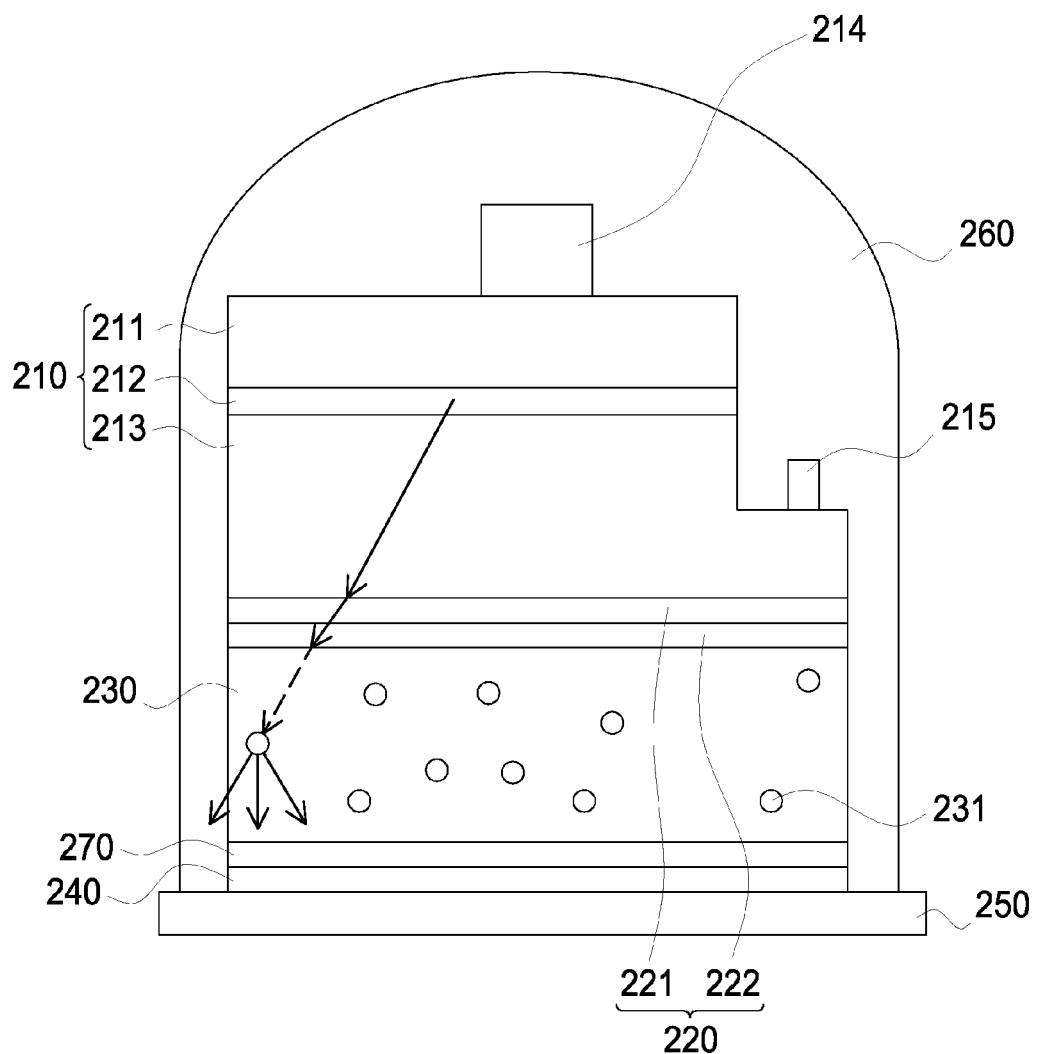
FIG. 2 shows a drawing to illustrate the first embodiment of the present application.

FIG. 2 is a drawing to illustrate the first embodiment of the present application. A light-emitting stack 210 is disposed above a substrate 230, and the substrate 230 and the light-emitting stack 210 are bonded with a bonding layer 220. During package, the substrate 230 is fixed to a carrier 250 with a fixing material 240, and then the whole structure is packaged with an encapsulation resin 260. The light-emitting stack 210 is a semiconductor stack comprising a first conductivity type semiconductor layer 211, an active layer 212, and a second conductivity type semiconductor layer 213 from top to bottom in sequence. The first conductivity type semiconductor layer 211 and the second conductivity type semiconductor layer 213 are of different conductivity types. For example, the first conductivity type semiconductor layer 211 is an n-type semiconductor layer, and the second conductivity type semiconductor layer 213 is a p-type semiconductor layer. When an external power is supplied, the first conductivity type semiconductor layer 211 and the second conductivity type semiconductor layer 213 generates carriers (electrons/holes) respectively, and the carriers recombine in the active layer 212 to generate light. The first conductivity type semiconductor layer 211, the active layer 212, and the second conductivity type semiconductor layer 213 comprise III-V group material, for example, AlGaInP series materials or AlGaInN series materials. In addition, a first electrode 214 is set on the first conductivity type semiconductor layer 211, and a second electrode 215 is set on the second conductivity type semiconductor layer 213 to conduct the electrical current. In this embodiment, the bonding layer 220 used to bond the substrate 230 and the light-emitting stack 220 may comprise the same material, or different materials of multiple layers as illustrated in FIG. 2. The bonding layer 220 of same material comprises a conductive material or a non-conductive material. The conductive material comprises a metal oxide, or a metal (or alloy) with a thickness less than 500 Å. For example, the metal may be Au, Ag, or Sn, and the metal oxide may be indium tin oxide (ITO), aluminum zinc oxide (AZO), cadmium tin oxide, antimony tin oxide, zinc oxide (ZnO), indium zinc oxide (IZO), or zinc tin oxide (ZTO). The non-conductive material comprises polymer, oxide, or fluoride. For example, the non-conductive material may be polyimide (PI), benzocyclobutene (BCB), perfluorocyclobutane (PFCB), or epoxy resin. The multiple layers of different materials for the bonding layer 220 is as shown in FIG. 2, and comprises a first bonding material layer 221 and the second bonding material layer 222, wherein the first bonding material layer 221 and the second bonding material layer 222 are of different materials. For example, the first bonding material layer 221 comprises aluminum oxide, and the second bonding material layer 222 comprises silicon oxide. The second bonding material layer 222 connects the substrate 230, and the first bonding material layer 221 is disposed between the second conductivity type semiconductor layer 213 and the second bonding material layer 222 to take the advantage of its good adhesion to a semiconductor material.

In addition, in this embodiment, the substrate 230 is a transparent substrate comprising a first material, and a medium 231 comprising a second material is contained inside in the first material, wherein the second material is different from the first material. The first material comprises sapphire, gallium oxide, gallium phosphide, gallium nitride, silicon carbide, aluminum nitride, zinc oxide, or glass. The medium 231 comprises a plurality of particles or voids containing air distributed in the transparent substrate, and the medium 231 can be disposed into the transparent substrate at the same time during the process when the transparent substrate is formed, and is surrounded by the first material of the transparent substrate. The second material of the medium 231 may be a material different from the first material so as to cause light scattering or refraction. The medium 231 can be a conductor, a non-conductor, or a semiconductor. For example, the conductor comprises graphite or metal; the non-conductor comprises air, diamond, diamond-like carbon or Bis(diethylammonium) tetrachlorocuprate (II) ($[(CH_3CH_2)_2NH_2]_2[CuCl_4]$); the semiconductors comprises titanium dioxide or zinc oxide. If the medium 231 is air, when the first material of the transparent substrate is glass, the medium 231 is formed by the air mixed into glass when the glass is in a melting state, which results in voids containing air distributed in the glass substrate. If the medium 231 is metal, the metal may be formed by metal ions implanted into the transparent substrate. For example, $Cu^+$ metal ions with a 40-keV energy may be implanted in a dose density of $1.0*10^{17}(ions/cm^2)$ into the transparent substrate with the sapphire as the first material. By this method, Cu particles are formed and dispersed in the sapphire substrate. Another example is that the medium 231 is Bis(diethylammonium) tetrachlorocuprate (II) ($[(CH_3CH_2)_2NH_2]_2[CUCl_4]$). Bis(diethylammonium) tetrachlorocuprate (II) ($[(CH_3CH_2)_2NH_2]_2[CuCl_4]$) is often used as a thermochromic material, and when the first material of the transparent substrate is glass, Bis(diethylammonium) tetrachlorocuprate (II) ($[(CH_3CH_2)_2NH_2]_2[CuCl_4]$) can be mixed into the glass when the glass is in a melting state to form particles.

Figure 1:
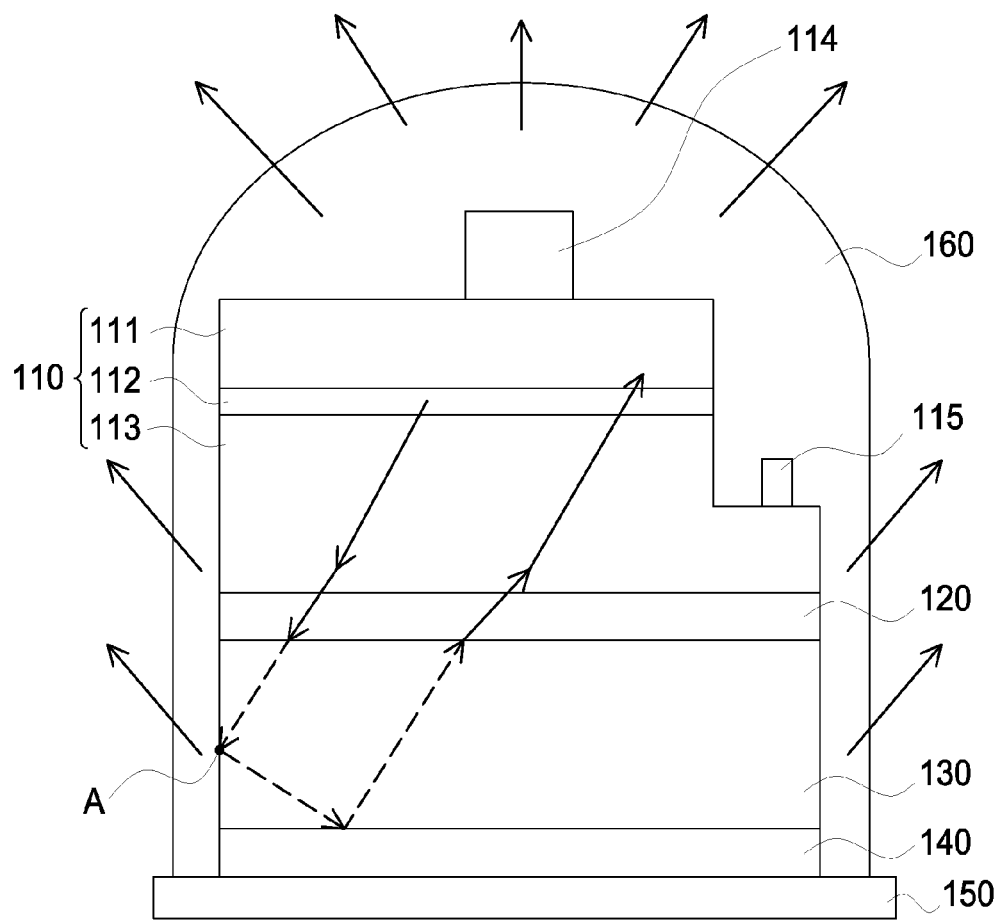
FIG. 1 shows a structure for a conventional light-emitting diode.

In the present embodiment, since the substrate 230 comprises the medium 231 contained inside the transparent substrate as illustrated in FIG. 2, when the downward light emitted from the light-emitting stack 210 travels to the substrate 230, compared with FIG. 1, because of the presence of the medium 231, the light can be scattered by the medium 231, or the light penetrates the medium 231 and is refracted and scattered (as depicted in the figure). This results in multiple lights, each with different traveling angles after being scattered, and each provides different incident angles related to the sidewall of the substrate 230 to increase the chance of light extraction. And for the light which is totally reflected internally at its first arrival at the sidewall of the substrate 230, when the light is reflected back to the substrate 230, there is a chance that the light may come across the medium 231, and the aforementioned scattering or refraction of light happens. The light extraction is therefore enhanced.

Depending on the selection of materials of the first material for the substrate 230, the second material for the medium 231, and the light-emitting stack 210, the refractive index of the second material for the medium 231 may be between the refractive indices of the light-emitting stack 210 and the first material for the substrate 230. For example, when sapphire is chosen to be the first material for the substrate 230, and diamond is chosen to be the second material for the medium 231, the refractive index (n=2.4) of the diamond is between the refractive index (n=3~3.5) of the AlGaInP series material of the light-emitting stack 210 and the refractive index (n=1.7) of the sapphire of the substrate 230, When light arrives at the medium 231, as mentioned above, light may penetrate the medium 231 and be refracted to change the incident angle of light and therefore light may be scattered. Similarly, depending on the selection of materials of the first material for the substrate 230 and the second material for the medium 231, the refractive index of the second material for the medium 231 may be smaller than the refractive index of the first material for the substrate 230. For example, when glass is chosen to be the first material for the substrate 230, and air is chosen to be the second material for the medium 231, the refractive index (n=1) of air is smaller than the refractive index (n=1.5~1.7) of glass of the substrate 230. When light hits the medium 231, due to the total internal reflection, the aforementioned scattering phenomenon may happen and light may be scattered.

Further, although the medium 231 in FIG. 2 is illustrated by a circle, depending on the selection of the medium 231, the shape may be irregular, and a maximum distance between two points of the shape varies from shape to shape. For example, the maximum distance is about 10 nm to 20 μm for air, about 1 nm to 10 μm for metal, and about 10 nm to 30 μm for diamond, diamond-like carbon, graphite, titanium oxide, zinc oxide, and Bis(diethylammonium) tetrachlorocuprate (II) ($[(CH_3CH_2)_2NH_2]_2[CuCl_4]$). In general, the maximum distance between two points of the shape of the medium 231 is in the range of about 1 nm to 30 μm.

In this embodiment, a reflective layer 270 is formed on the substrate 230 and disposed between the substrate 230 and the fixing material 240. The reflective layer 270 may be a metal material, such as aluminum, gold, platinum, zinc, silver, nickel, germanium, indium, tin and other metals or alloys thereof. The reflective layer 270 may also be a combination of metal and oxide, such as indium tin oxide/silver (ITO/Ag), indium tin oxide/aluminum oxide/silver (ITO/AlOx/Ag), titanium oxide/silicon oxide/aluminum (TiOx/SiOx/Al), indium tin oxide/silicon nitride/aluminum (ITO/SiNx/Al), indium tin oxide/silicon nitride/silver (ITO/SiNx/Ag), indium tin oxide/silicon nitride/aluminum oxide/aluminum (ITO/SiNx/Al$_2$O$_3$/Al), or indium tin oxide/silicon nitride/aluminum oxide/silver (ITO/SiNx/Al$_2$O$_3$/Ag), etc. The reflective layer 270 reflects light which is not extracted from the sidewalls of the substrate 230 and continues to travel downward back again to the substrate 230 and light is extracted from the sidewall. And when the light hits the medium 231 again, as mentioned above, the light may be scattered, or the light may penetrate the medium 231 and be refracted so the incident angle is changed and the light is scattered. Therefore, these designs in the present application greatly improve the sidewall light extraction of an LED.

Figure 3:
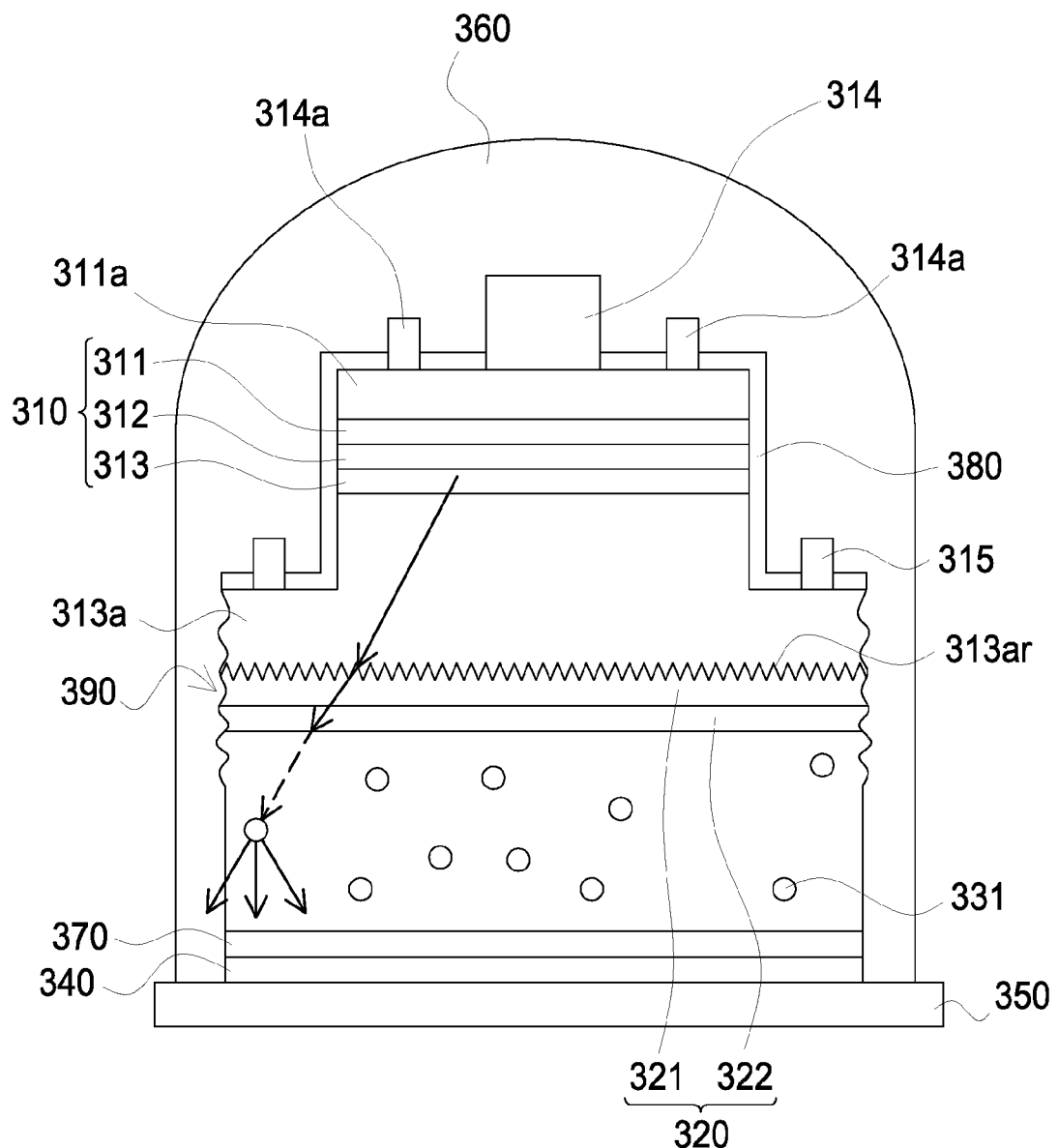
FIG. 3 shows a drawing to illustrate the second embodiment of the present application.

FIG. 3 illustrates the second embodiment of the present application. In this embodiment, some elements are the same as the elements in FIG. 2 so the first digit of the label code for such element is changed from "2" in FIGS. 2 to "3". For example, the element 211 in FIG. 2 is the first conductivity type semiconductor layer 211, to which the element 311 corresponds is also a first conductivity type semiconductor layer 311.

In this embodiment, the light-emitting stack 310 is a semiconductor stack of AlGaInP series material. The first conductivity type semiconductor layer 311 is an n-type semiconductor layer, and the second conductivity type semiconductor layer 313 is a p-type semiconductor layer. A first window layer 311a is disposed on the first conductivity type semiconductor llayer 311 which may also comprise a material of AlGaInP series material. A second window layer 313a is disposed on the second conductivity type semiconductor layer 313. The second window layer 313a is between the second conductivity type semiconductor layer 313 and the bonding layer 320. The second window layer 313a may also comprise a material of AlGaInP series material, for example, GaP. Both window layers improve light extraction because the thicknesses thereof are increased and light extraction from the sidewalls is improved. In addition, the surface of the second window layer 313a adjoining the bonding layer 320 is a roughed surface comprising roughing structures 313ar which diffuse light to enhance light extraction. The roughed surface can be formed during the growth of the epitaxial process of the light-emitting diodes, or be formed by using a chemical etch or an inductive coupling plasma (ICP) dry etch technology to etch part of the second window layer 313a. The roughed surface can also be formed by a pre-determined pattern mask etching technology. A pre-determined pattern is formed on the surface of the second window layer 313a as a mask which comprises a semi-sphere, a pyramid or a cone, and the roughed surface is then formed by etching the surface on which the pre-determined pattern is formed. Further, in this embodiment, the first electrode 314 is disposed on the first window layer 311a, and the second electrode 315 is disposed on the second window layer 3131a. The first electrode 314 is provided with extending electrodes 314a to improve current spreading. Similarly, the second electrode 315 is designed in a fork shape with two prongs (as viewed from the top view) for the purpose of current spreading, and therefore as shown in the feature, second electrodes 315 are shown on both left and right sides in this cross-sectional view. In addition, an anti-reflection layer 380 is disposed on the outermost of the light-emitting diode. The material of the anti-reflection layer 380 may be selected to have a refractive index between the refractive indices of the first window layer 311a and the encapsulation resin 360 so that when light travels from the first window layer 311a to the peripheral encapsulation resin 360, the TIR (Total Internal Reflection) can be reduced. For example, silicon nitride is selected as the anti-reflection layer 380 in this embodiment.

In addition, when the wafer is cut into chips for the light-emitting diodes, depending on the laser types used, cutting parameters (such as laser energy), and the materials of layers of the light-emitting diode which are cut, the formation of the byproducts after laser-cut is different. Measuring the amount of light emitted from the sidewalls can determine whether it is needed to perform a laser byproduct remove (LBR) process. When there are not many byproducts and the transmittance of byproducts is good, byproducts becomes a rough structure to enhance light extraction from the sidewalls, and the laser byproduct remove (LBR) process is not needed. The present embodiment illustrates the case that the byproducts are removed. After the laser byproduct removal (LBR) process, rough surfaces 390 are formed at the areas of the sidewalls which are cut by the laser to increase the effect of the light extraction from the sidewalls.

The above-mentioned embodiments are only examples to illustrate the theory of the present invention and its effect, rather than be used to limit the present invention. Other alternatives and modifications may be made by a person of ordinary skill in the art of the present application without escaping the spirit and scope of the application, and are within the scope of the present application.

What is claimed is:

1. A light-emitting device, comprising:
a semiconductor stack;
a transparent substrate comprising a first material;
a bonding layer which bonds the semiconductor stack and the transparent substrate, wherein the bonding layer directly contacts the transparent substrate; and
a medium in the transparent substrate, the medium comprising a second material different from the first material, wherein the first material comprises sapphire while the second material comprises diamond, diamond-like carbon, or metal, or wherein the first material comprises glass while the second material comprises Bis(diethylammonium) tetrachlorocuprate (II) ($[(CH_3CH_2)_2 NH_2]_2 [CuCl_4]$).

2. The light-emitting device as claimed in claim 1, further comprising a reflective layer on the transparent substrate.

3. The light-emitting device as claimed in claim 1, wherein the medium and the transparent substrate are devoid of any phosphor material.

4. The light-emitting device as claimed in claim 2, further comprising a first electrode and a second electrode, wherein the first electrode and the second electrode are on an opposite side of the transparent substrate to the reflective layer wherein the second material comprises a conductor, a non-conductor, or a semiconductor.

5. The light-emitting device as claimed in claim 1, wherein the metal is formed by metal ions implanted into sapphire.

6. The light-emitting device as claimed in claim 1, wherein the medium comprising diamond, diamond-like carbon, or Bis(diethylammonium) tetrachlorocuprate (II) ($[(CH_3CH_2)_2 NH_2]_2[CuCl_4]$) is disposed into the transparent substrate at the same time during the process when the transparent substrate is formed.

7. The light-emitting device as claimed in claim 1, further comprising rough surfaces on sidewalls of the transparent substrate wherein the bonding layer comprises a conductor or a non-conductor.

8. The light-emitting device as claimed in claim 1, wherein the bonding layer is a non-conductor which comprises a polymer, an oxide, or a fluoride.

9. The light-emitting device as claimed in claim 1, wherein the bonding layer comprises multiple layers of different materials.

10. The light-emitting device as claimed in claim 1, wherein the bonding layer comprises a metal oxide, a metal with a thickness less than 500 Å or an alloy with a thickness less than 500 Å.

11. The light-emitting device as claimed in claim 1, wherein the refractive index of the second material is between the refractive indices of the light-emitting stack and the first material.

12. The light-emitting device as claimed in claim 1, wherein the refractive index of the second material is smaller than the refractive index of the first material.

13. The light-emitting device as claimed in claim 1, wherein a maximum distance between two points of the shape of the medium is in the range of about 1 nm to 30 μm.

* * * * *